United States Patent [19]
Savage, Jr.

[11] Patent Number: 5,709,554
[45] Date of Patent: Jan. 20, 1998

[54] ANGLED CIRCUIT CONNECTOR STRUCTURE

[76] Inventor: John M. Savage, Jr., 538-B Via De La Valle, Solana Beach, Calif. 92075

[21] Appl. No.: 606,012

[22] Filed: Feb. 12, 1996

[51] Int. Cl.⁶ ............................................. H01R 9/09
[52] U.S. Cl. ..................... 439/56; 439/541.5; 362/800
[58] Field of Search ............................ 439/56, 541.5, 439/717, 701, 79, 80; 361/730; 362/800

[56] References Cited

U.S. PATENT DOCUMENTS

| | | |
|---|---|---|
| 3,887,803 | 6/1975 | Savage, Jr. . |
| 4,035,681 | 7/1977 | Savage, Jr. . |
| 4,065,198 | 12/1977 | Jordan . |
| 4,195,330 | 3/1980 | Savage, Jr. . |
| 4,398,240 | 8/1983 | Savage, Jr. . |
| 4,402,110 | 9/1983 | Savage, Jr. . |
| 4,423,465 | 12/1983 | Teng-Ching et al. .................. 361/730 |
| 4,425,018 | 1/1984 | Stenz ......................................... 439/717 |
| 4,471,414 | 9/1984 | Savage, Jr. . |
| 4,491,900 | 1/1985 | Savage, Jr. . |
| 4,583,807 | 4/1986 | Kaufman et al. . |
| 4,612,602 | 9/1986 | Weyer et al. ........................... 361/730 |
| 4,667,277 | 5/1987 | Hanchar ................................... 362/800 |
| 4,674,008 | 6/1987 | Oyama et al. . |
| 4,676,565 | 6/1987 | Reichardt . |
| 4,727,648 | 3/1988 | Savage, Jr. . |
| 4,790,763 | 12/1988 | Weber et al. . |
| 4,837,927 | 6/1989 | Savage, Jr. . |
| 4,897,769 | 1/1990 | Lang . |
| 5,116,229 | 5/1992 | Savage, Jr. . |

FOREIGN PATENT DOCUMENTS 555933  8/1993  European Pat. Off. ............... 439/701

*Primary Examiner*—Neil Abrams
*Assistant Examiner*—Tho D. Ta
*Attorney, Agent, or Firm*—William W. Haefliger

[57] ABSTRACT

For use in an assembly including a circuit element having a base and a terminal projecting rearwardly from the base, a connector comprising a body defining a forwardly and horizontally extending structure for telescopically interfitting the element base for retention thereto, with the terminal then extending rearwardly, and the body having associated terminal structure movably electrically connectible with rearward extent of the terminal, the terminal structure and body extending downwardly for electrical connection to circuitry associated with a circuit board.

7 Claims, 19 Drawing Sheets

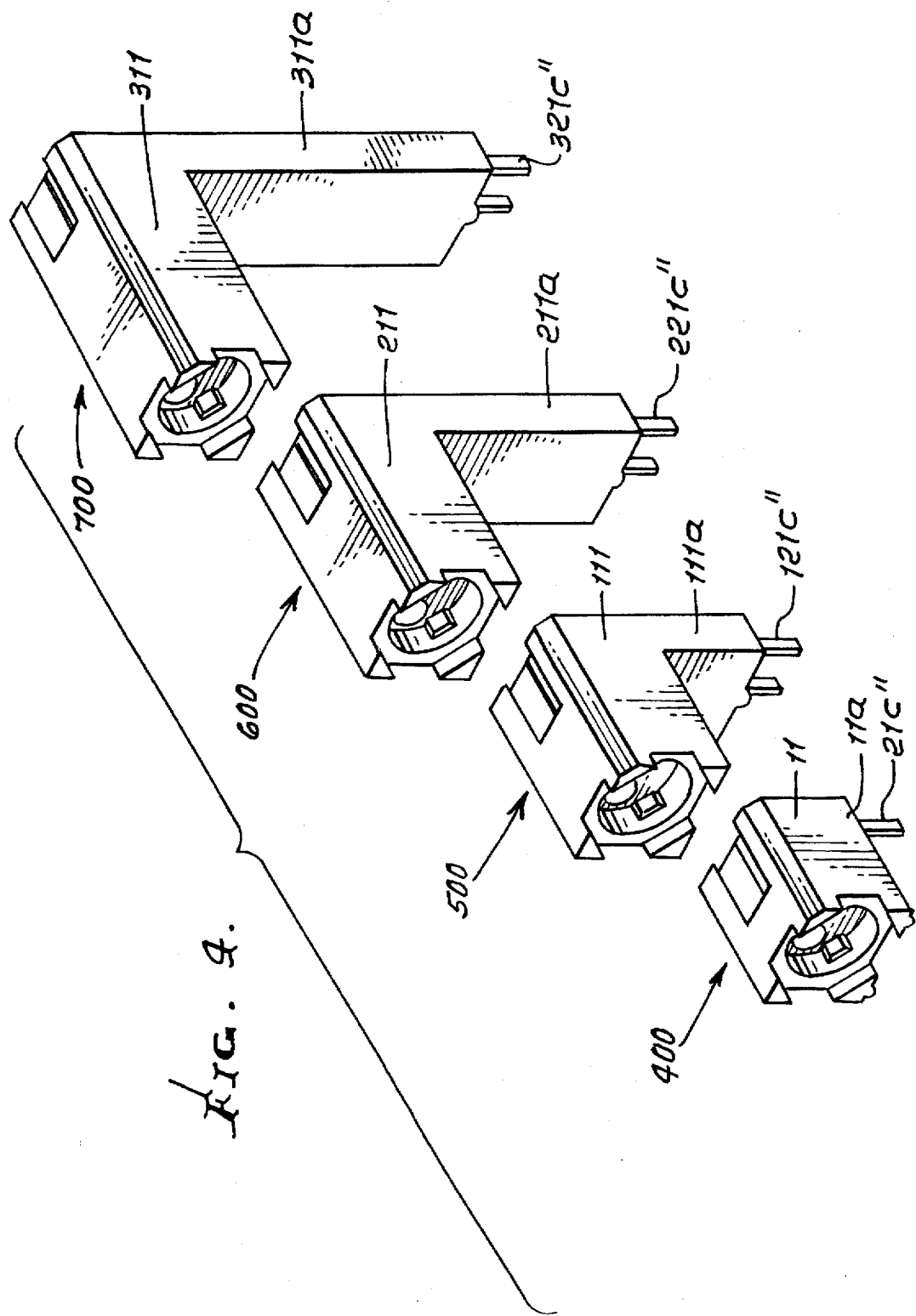

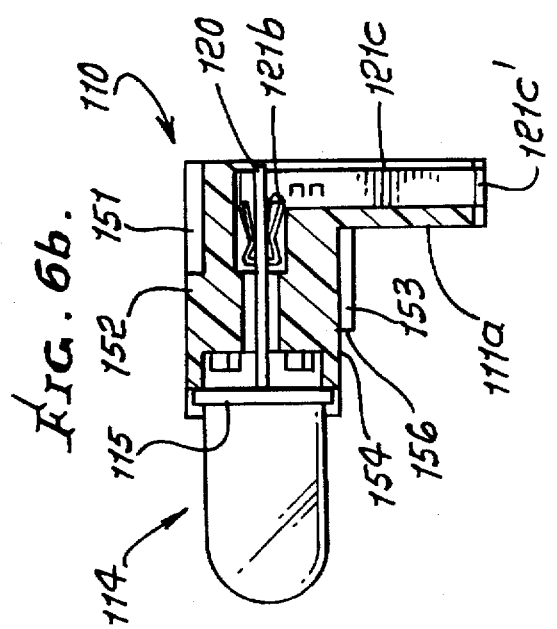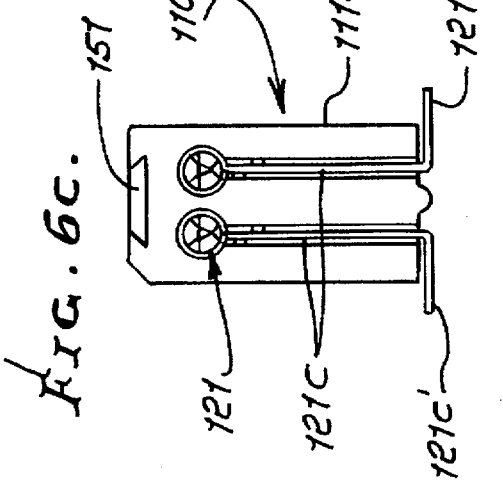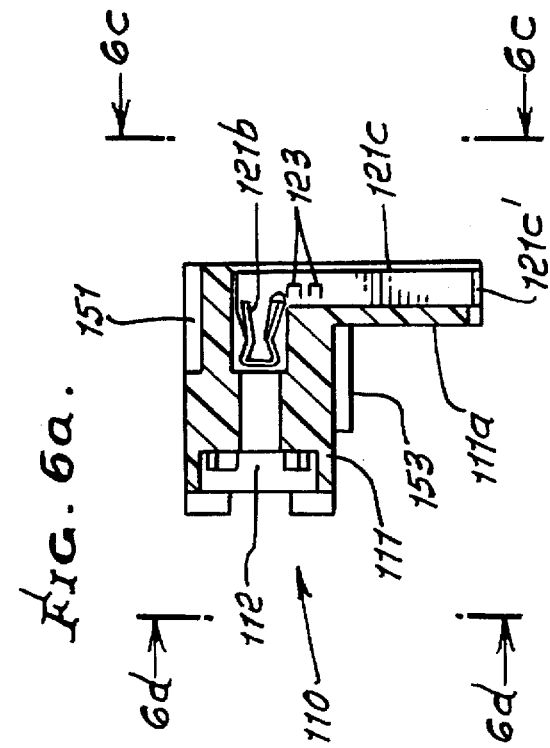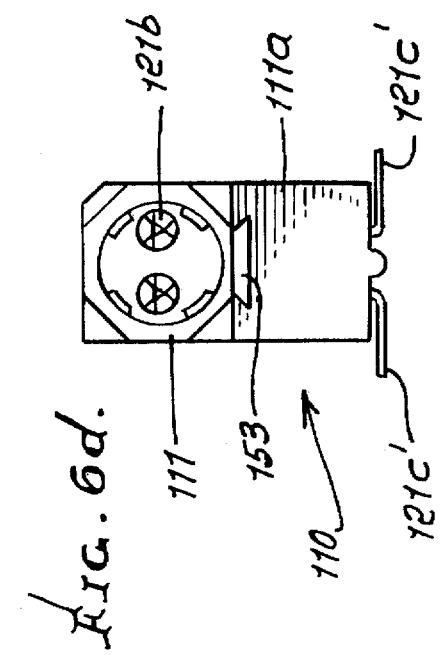

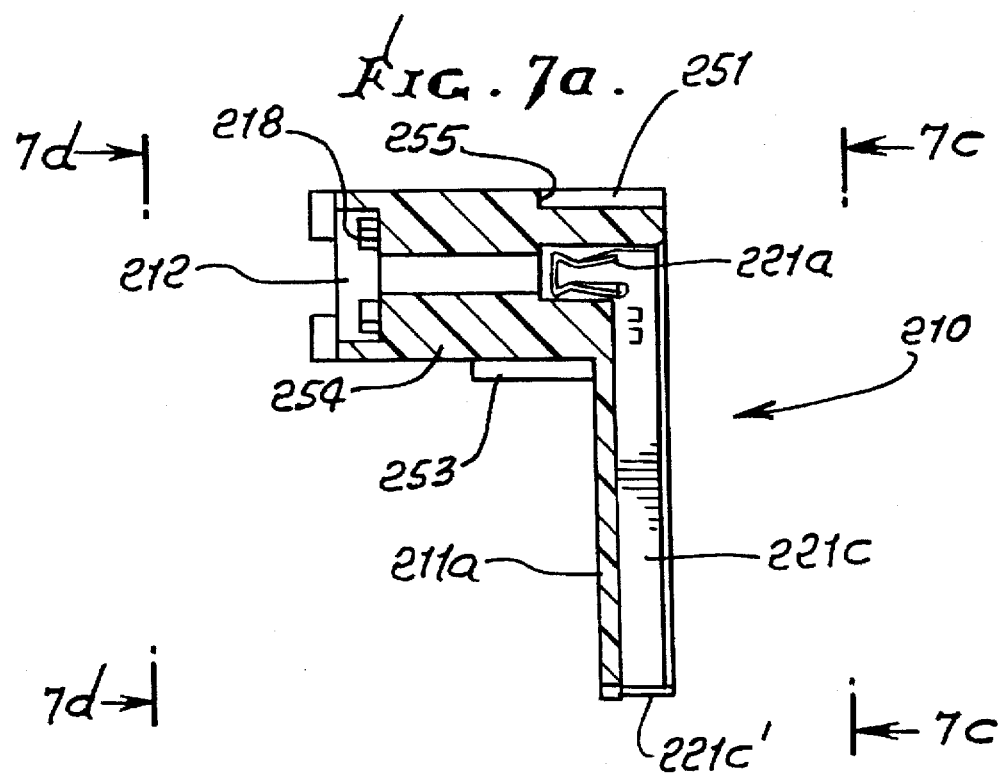
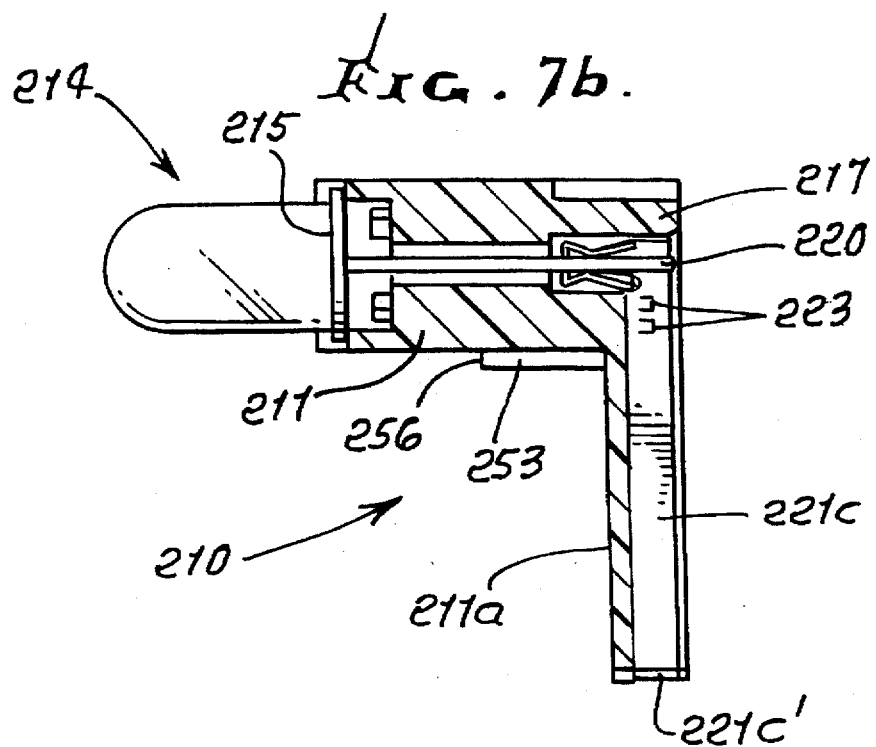

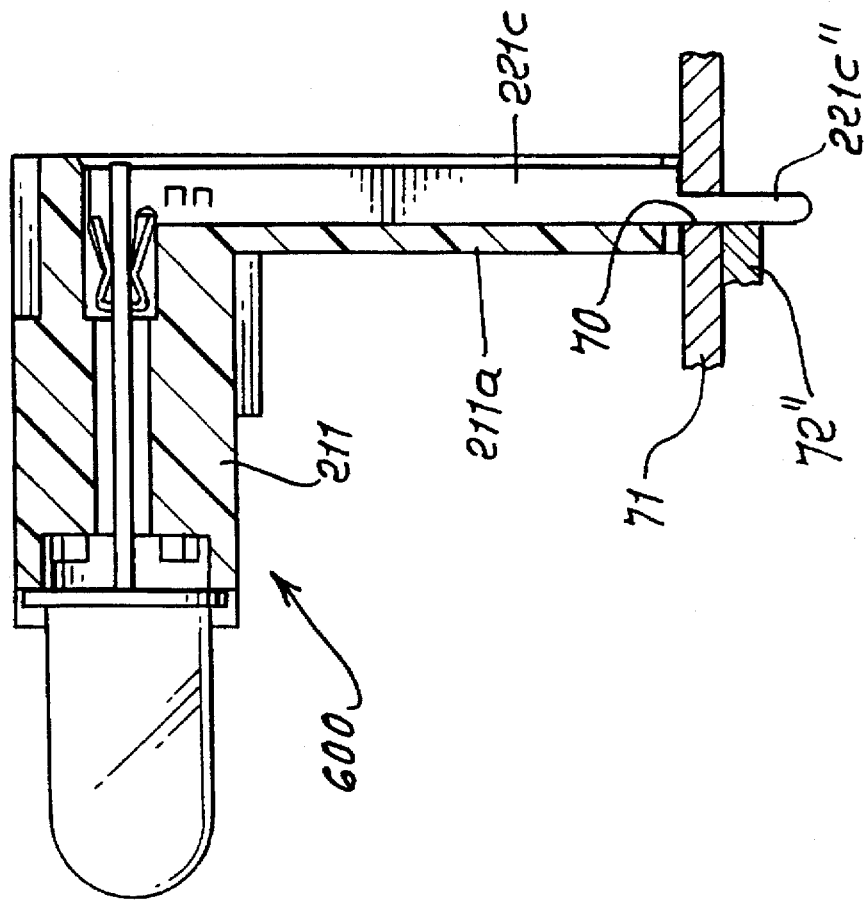
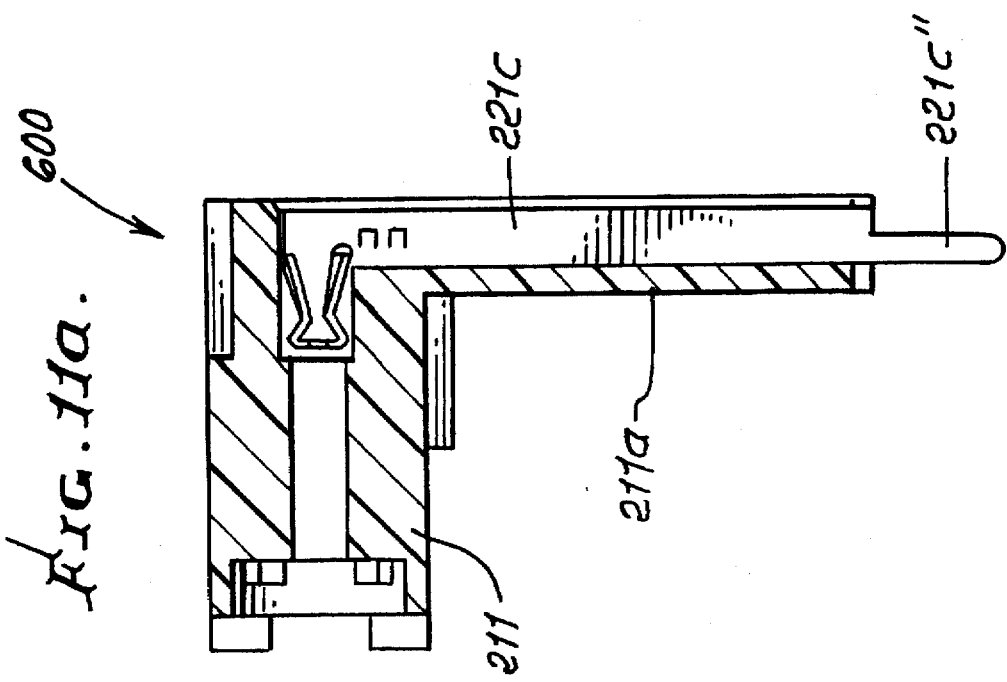

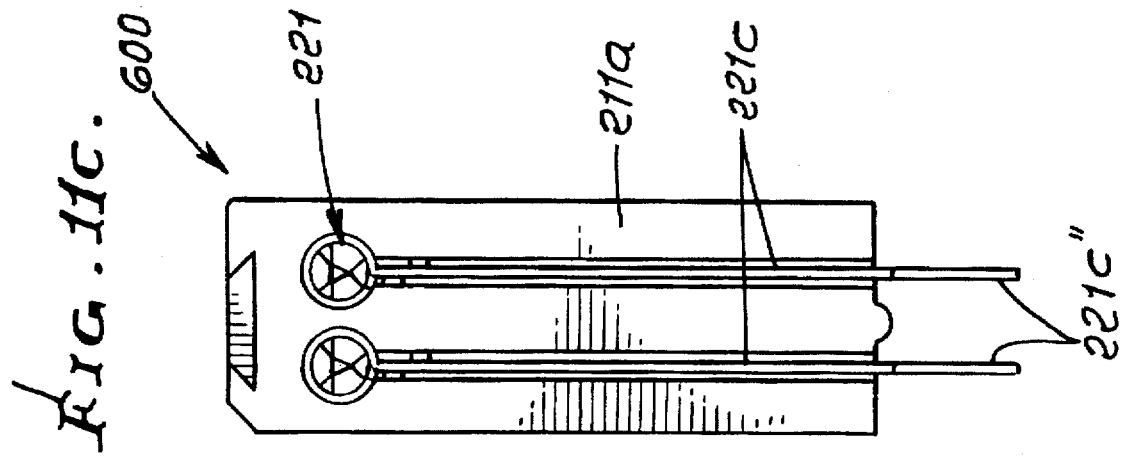
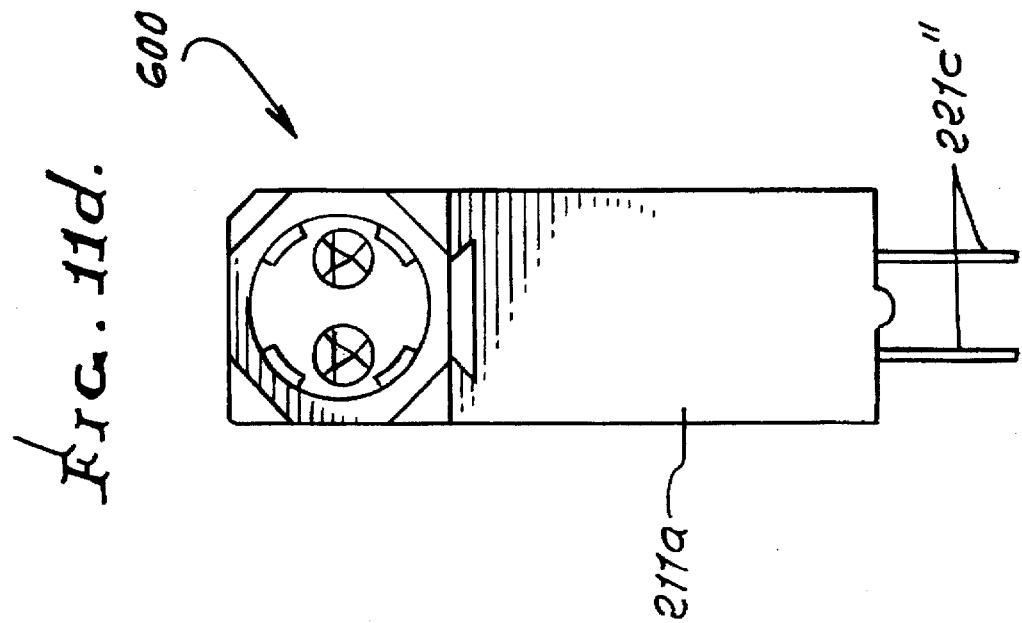

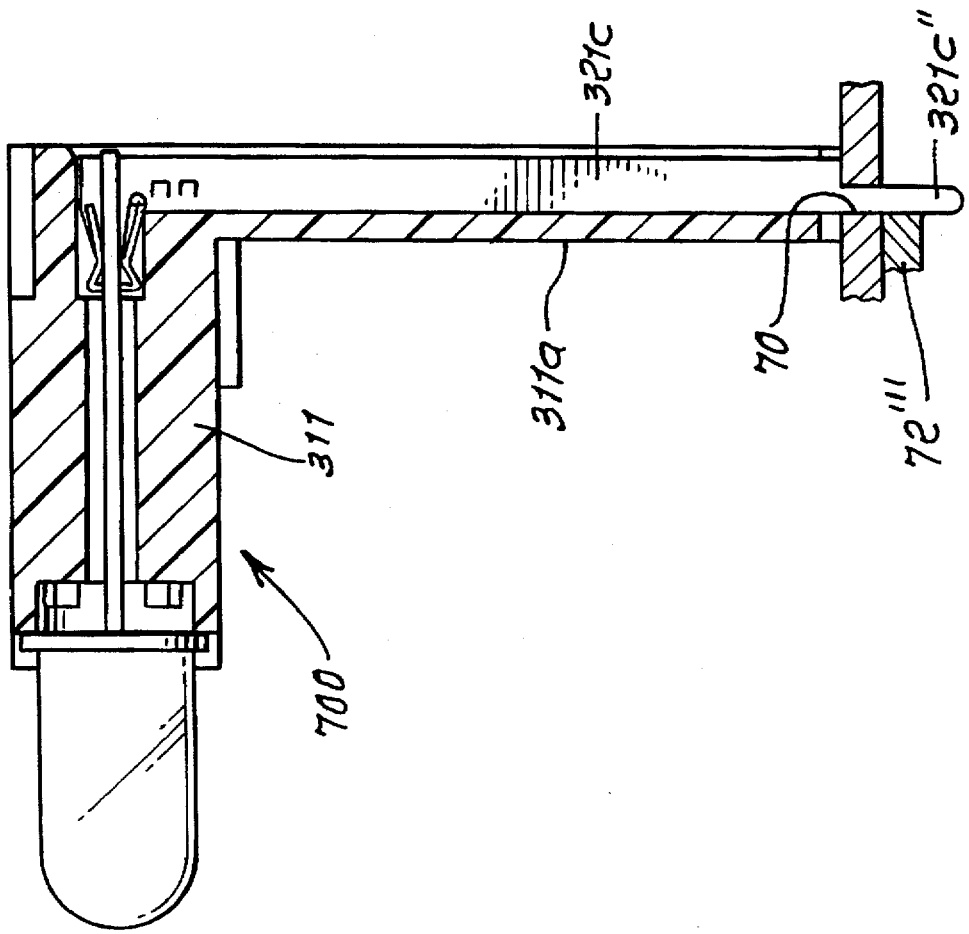
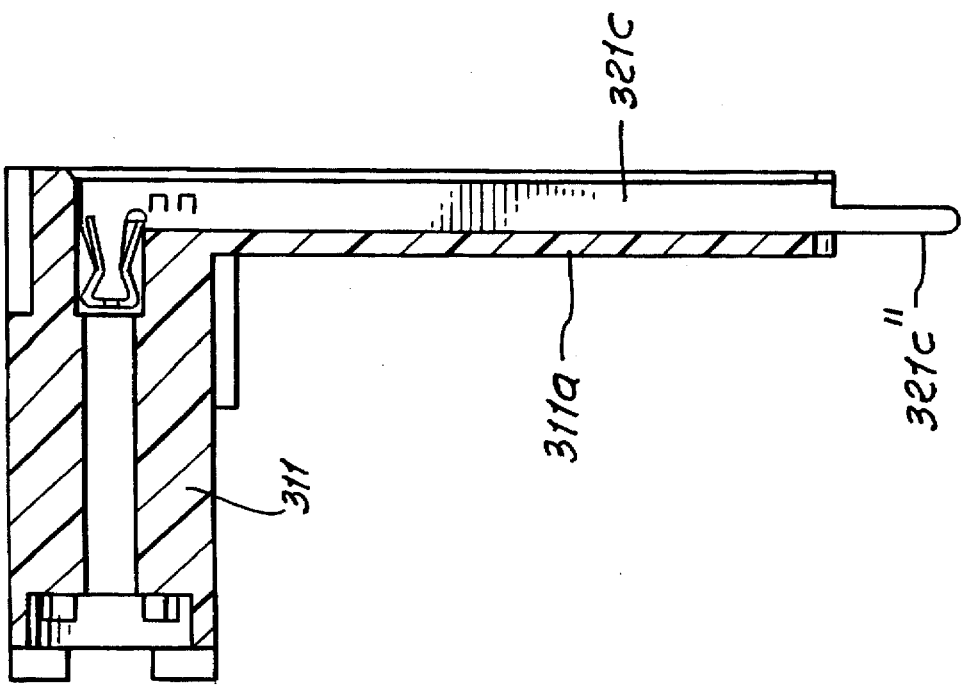

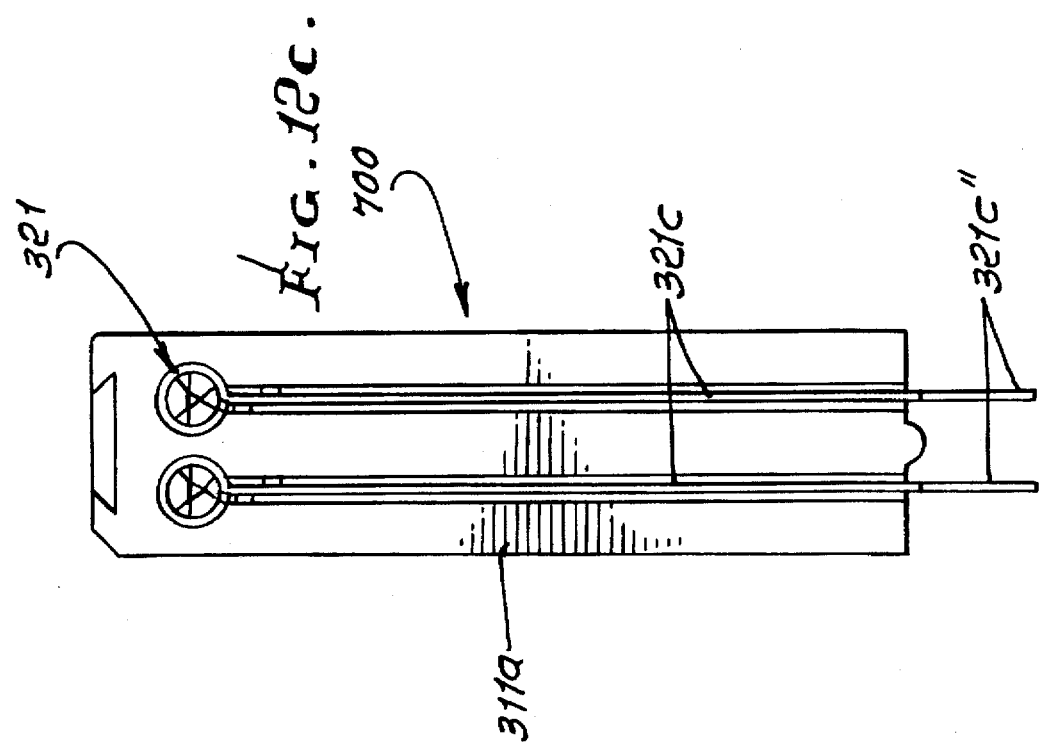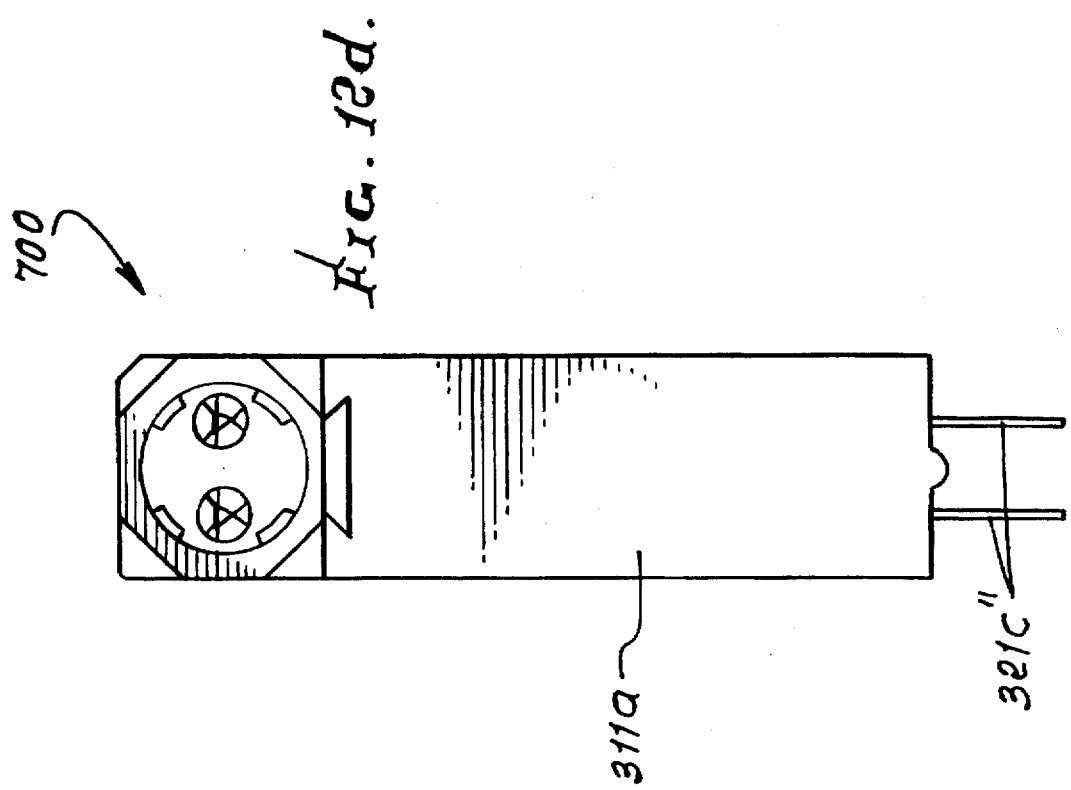

ANGLED CIRCUIT CONNECTOR STRUCTURE

BACKGROUND OF THE INVENTION

This invention relates generally to the connection of circuit elements, as for example light units, to panel or circuit boards, and more particularly concerns the provision of angled circuit connector structure to retain circuit element terminals in configured condition for connection to panels or circuit boards while maintaining the light units angled, as for example parallel to the panels or boards.

In my prior U.S. Pat. No. 4,195,330, apparatus is disclosed for quickly mounting a light unit, such as an LED for example, to a panel, with unusual advantages. There is presently need for mounting circuit components to circuit boards in different ways or positions. U.S. Pat. No. 4,837,927 discloses one way to achieve mounting of circuit component terminals to circuit boards with terminals extending perpendicular or parallel to board surfaces; however, there remains need to achieve such multiple mode mounting with terminals of different groupings held in configured condition as described herein, to obviate problems of spring-back that occur upon terminal bending. There is also need to enable close stacking of circuit components.

SUMMARY OF THE INVENTION

It is a major object of the invention to provide method and means to meet the above need, in an efficient, simple and reliable way.

In its apparatus aspects, the invention is directed to mounting of an assembly including a circuit element having a base and terminal means projecting rearwardly from that base, with a connector comprising:

a) a body defining a forwardly and horizontally extending structure for telescopically interfitting the base of the element for retention thereto, with the terminal means extending rearwardly, b) the body having associated terminal structure movably electrically connectible with rearward extent of the terminal means, the terminal structure extending downwardly toward a circuit board for electrical connection to circuitry associated with that circuit board.

As will be seen, the terminal structure typically includes a socket to slidably receive the terminal means when the base of the element is telescopically interfitted with the body structure. Also, the body typically defines a stand-off mount projecting downwardly relative to the forwardly extending body structure, the terminal structure projecting downwardly adjacent the stand-off mount. The stand-off mount defines a channel receiving the terminal structure, and the mount typically has a lower end to project in proximity to a circuit board, the terminal structure projecting below the level of the mount lower end. In this regard, the terminal structure may have a lowermost portion extending generally horizontally adjacent the mount lower end; or the terminal structure may have a lowermost portion projecting downwardly below the mount lower end, for electrical connection to circuitry at the circuit board.

An additional object includes provision of interconnect means on the body to connect to an associated connector having a configuration as defined in claim 1. Such joined multiple connectors may have a vertically stacked relation, i.e. stacked in "piggy-back" relation. The associated connector may have a stand-off mount projecting downwardly rearwardly of the first mentioned connector to which it is joined, and additional connectors may be stack connected as referred to. Provision for L-shape of the connectors, with progressively elongated stand-off mounts, facilitates their closely stacked relation as described, which in turn saves circuit board space for other connectors.

These and other objects and advantages of the invention, as well as the details of an illustrative embodiment, will be more fully understood from the following specification and drawings, in which:

DRAWING DESCRIPTION

FIG. 4 is a view like FIG. 3, but with modified lower ends of the connector adapting through hole socket mounting;

FIG. 6(a) is a view like FIG. 5(a), but showing the next in sequence connector of FIG. 3;

Figure 3:
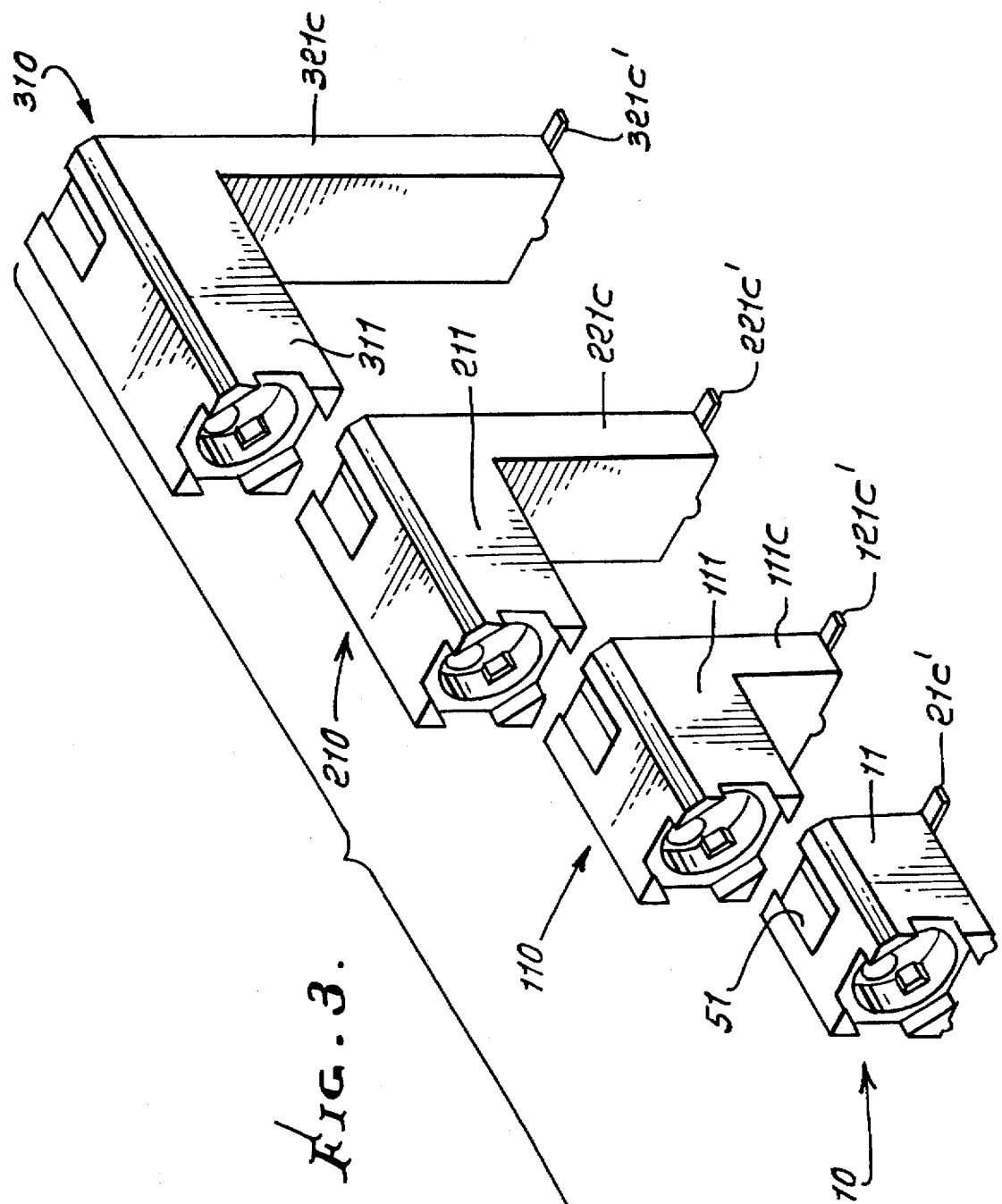
FIG. 3 is a view like FIG. 1, but showing the multiple connectors in alignment, but separated condition, the lower ends of the connectors adapted for surface mounting on a circuit board.
Figure 5A:
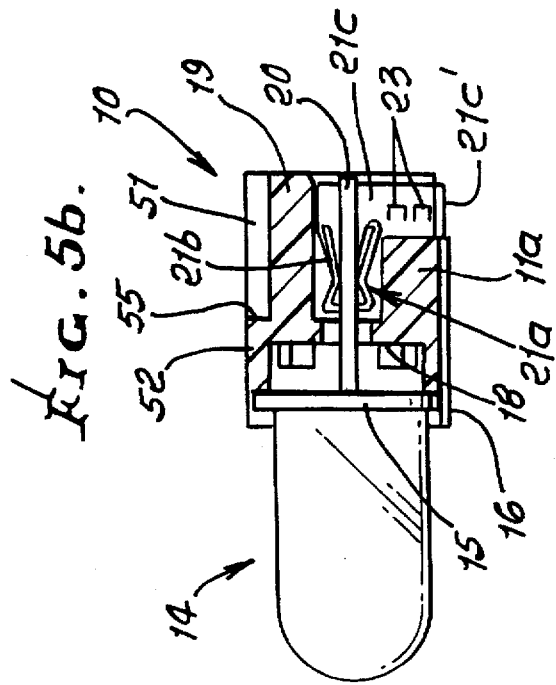
FIG. 5(a) is a vertical section taken through the smallest connector shown in FIG. 3.
Figure 5B:
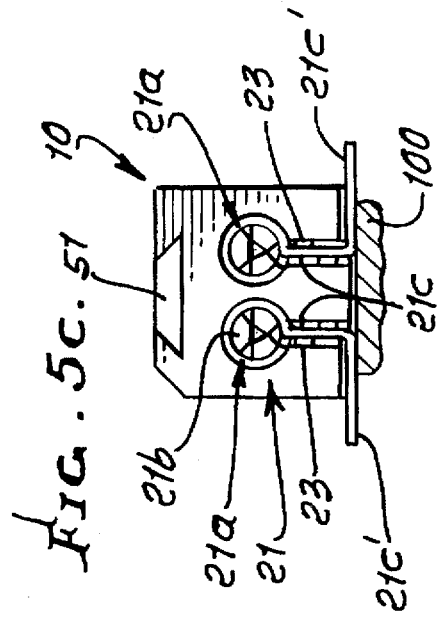
FIG. 5(b) is a view like FIG. 5(a) showing a light unit attached.
Figure 5D:
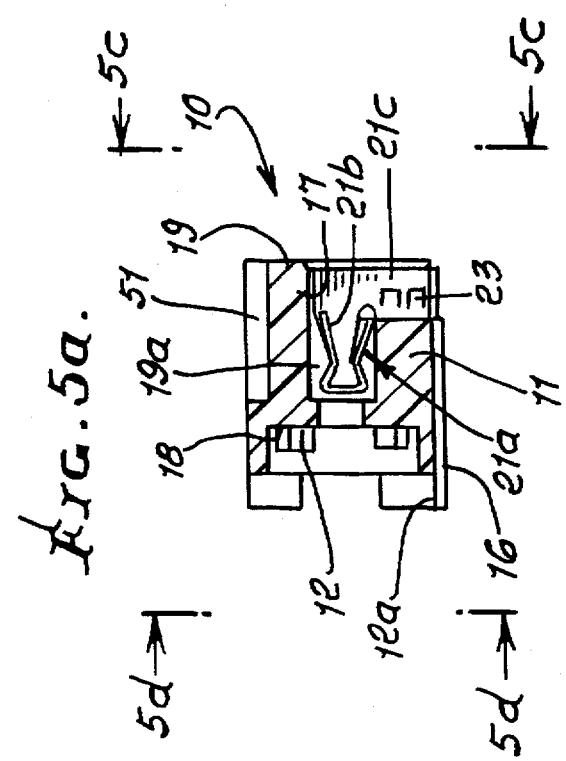
FIG. 5(c) is a right end elevational view taken on lines 5(c)—5(c) of FIG. 5(a)
FIG. 5 (d) is a left end view taken on lines 5(d)—5(d) in FIG. 5(a)
Figure 5C:
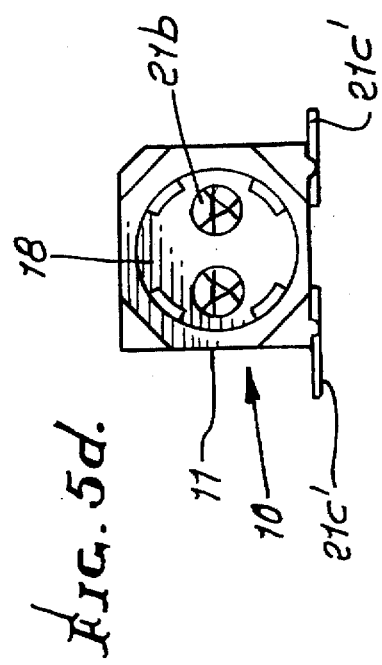
Figure 7C:
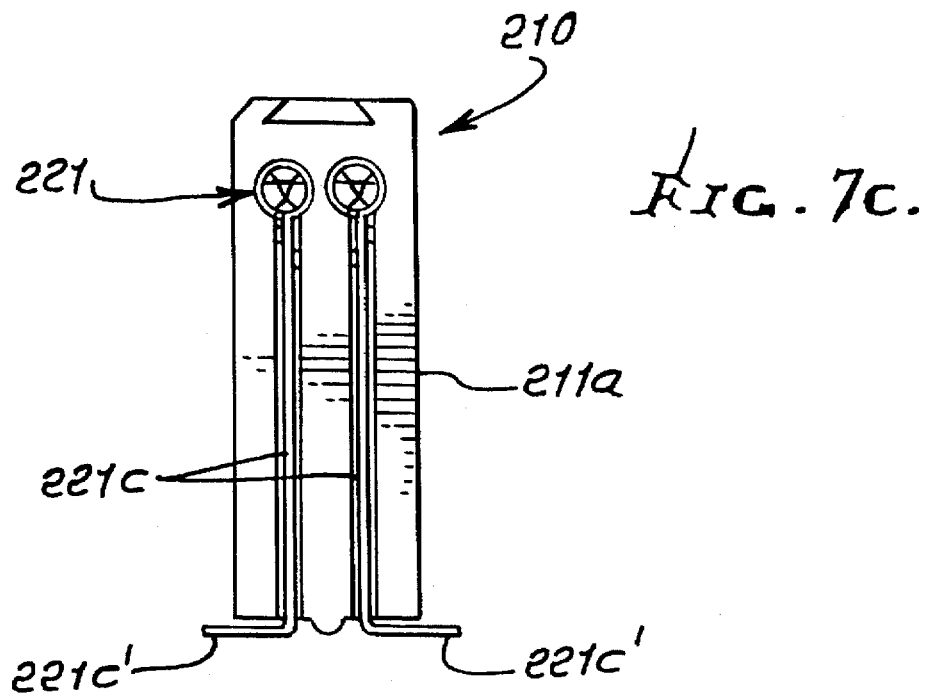
Figure 7D:
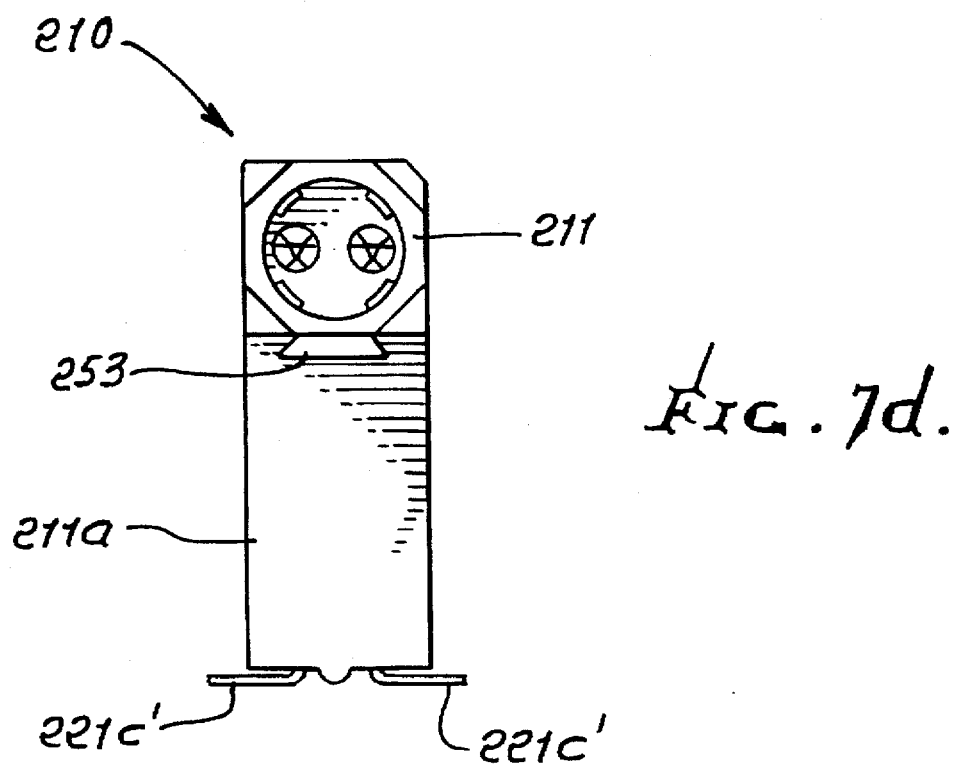
Figure 8A:
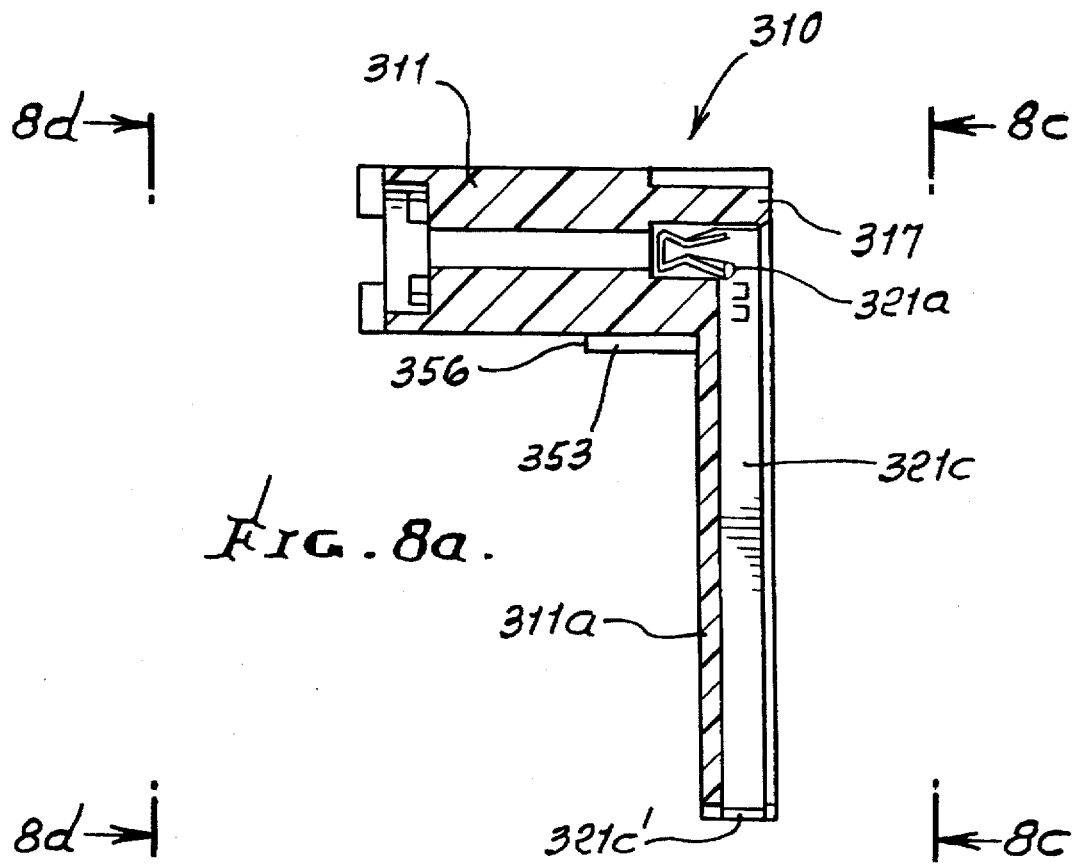
Figure 8B:
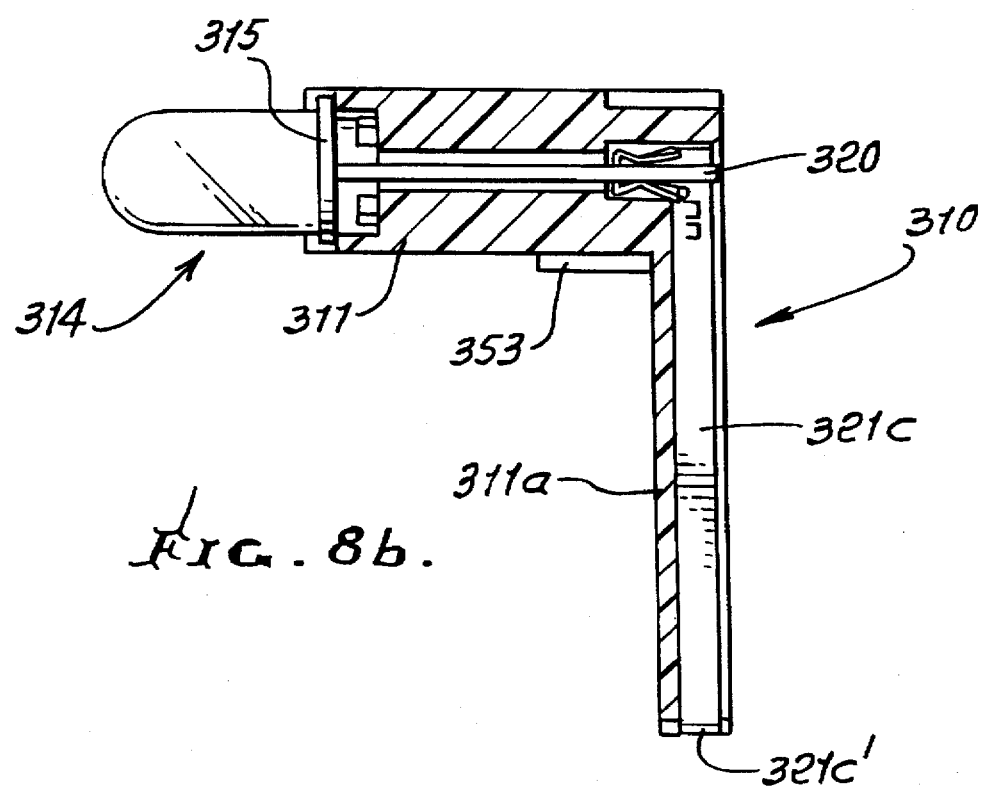
Figure 8C:
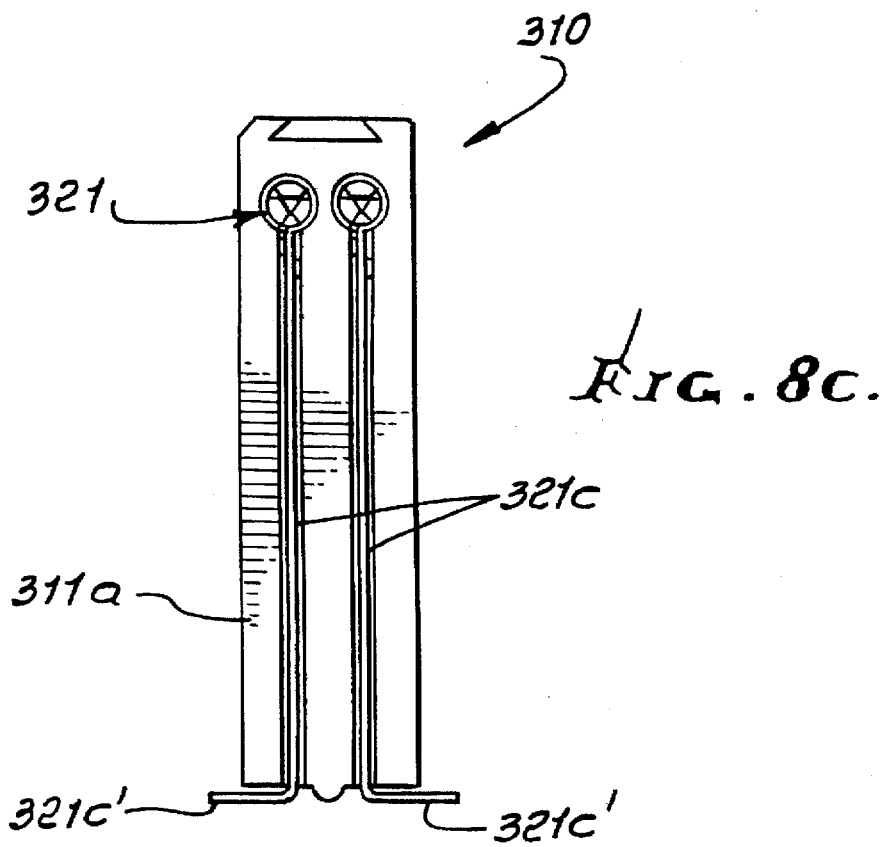
Figure 8D:
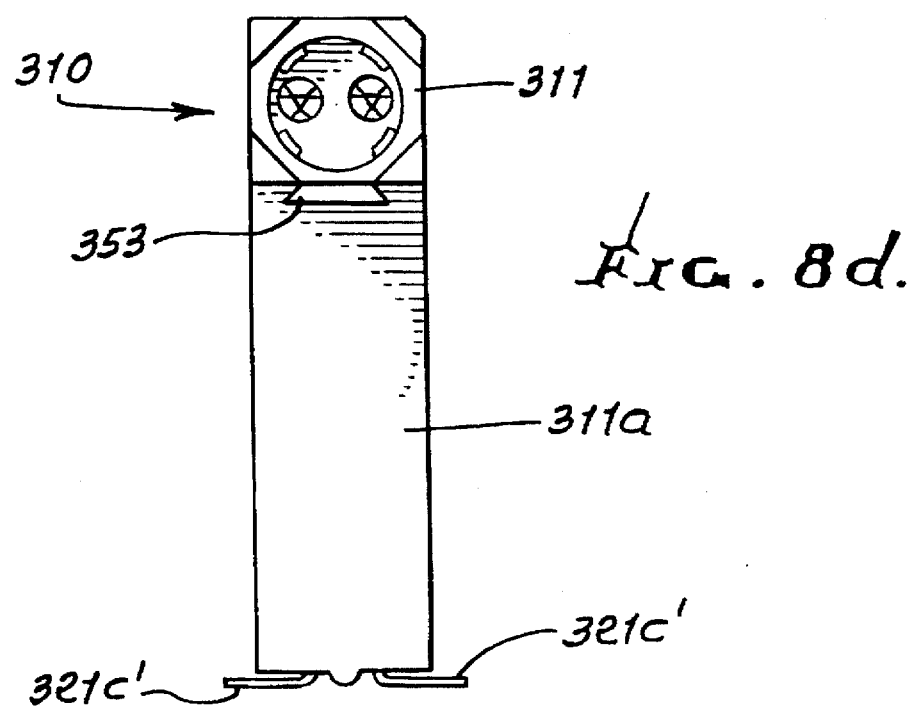
Figure 9A:
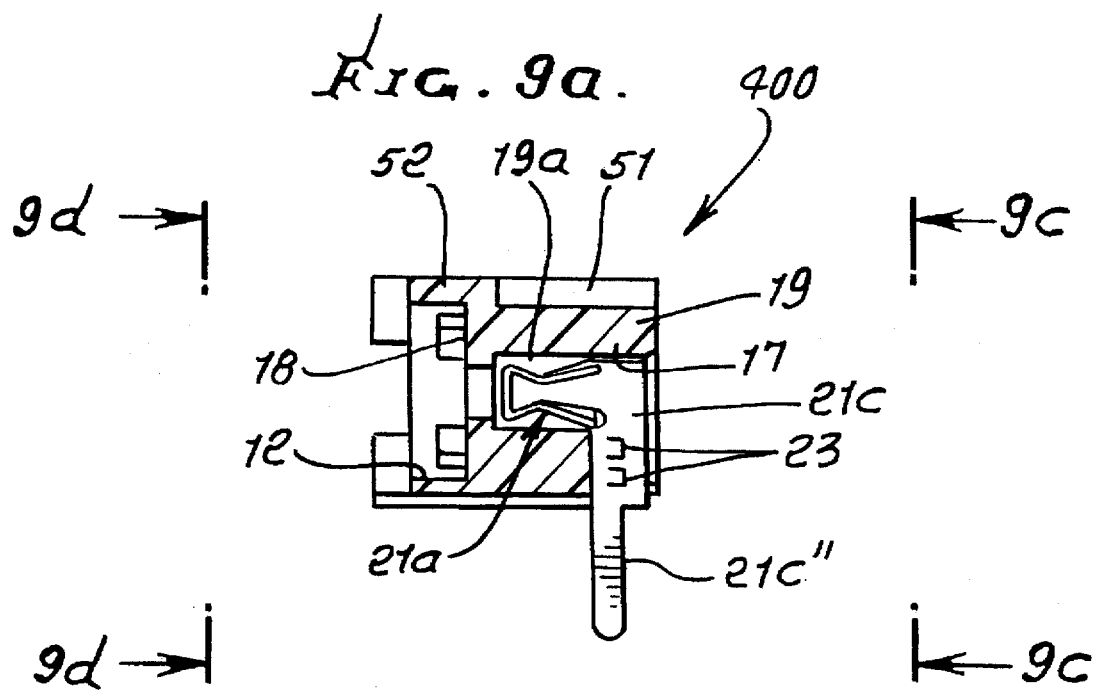
Figure 9B:
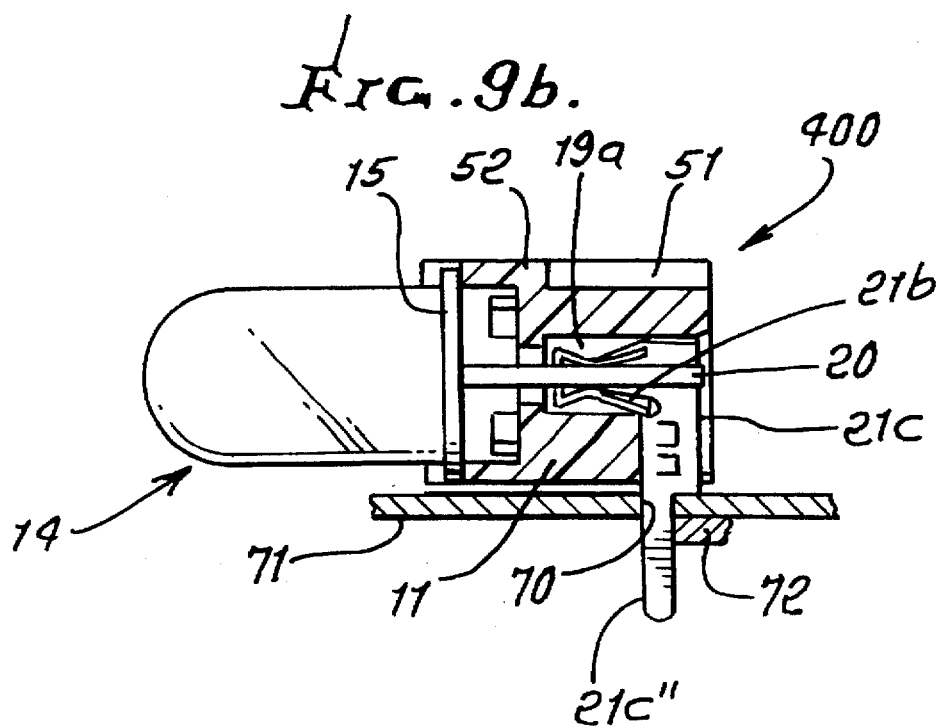
Figure 9C:
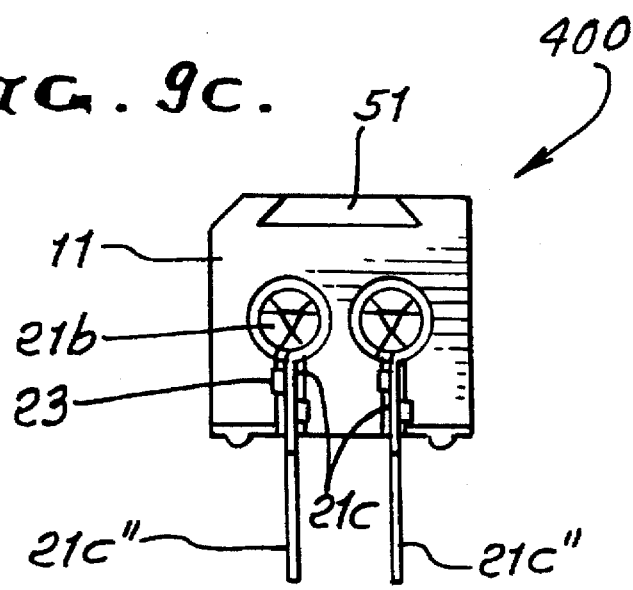
Figure 9D:
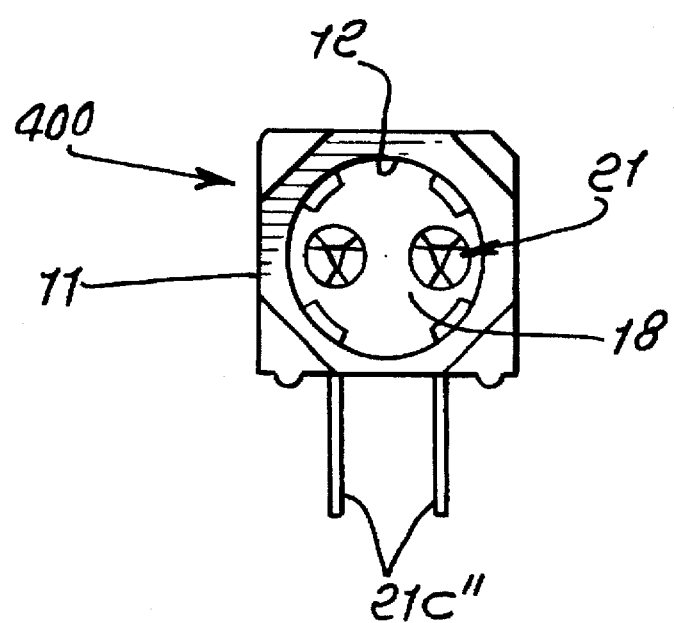
Figure 10A:
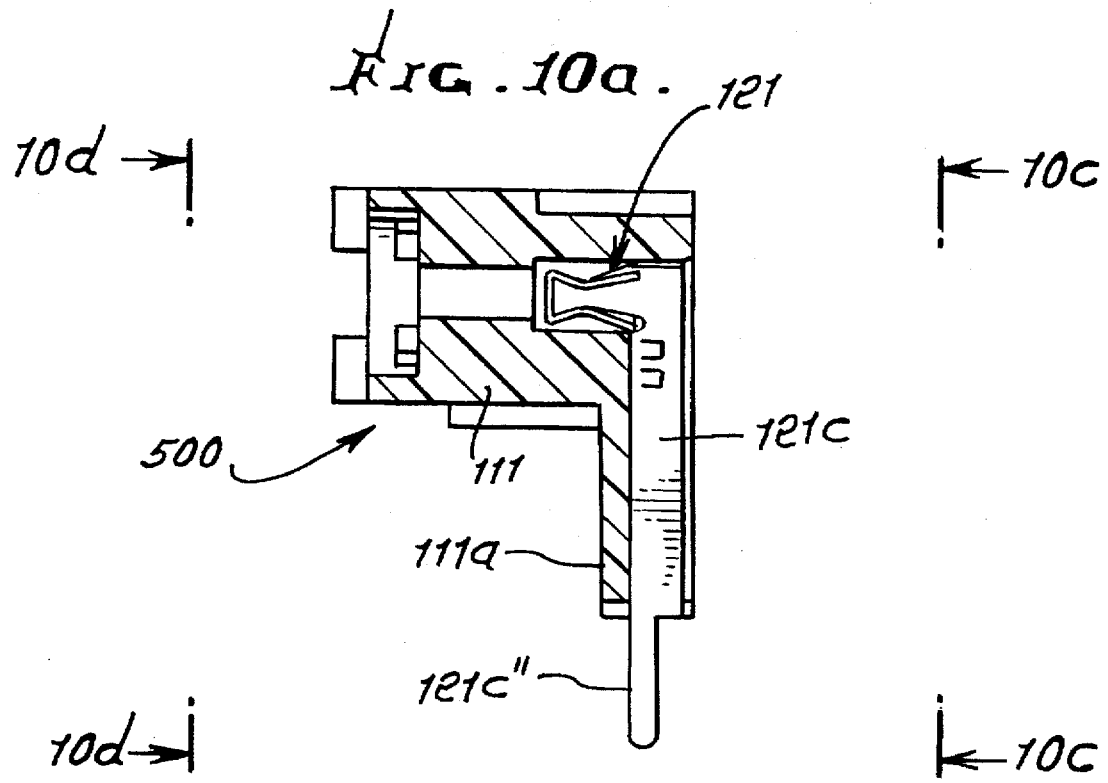
Figure 10B:
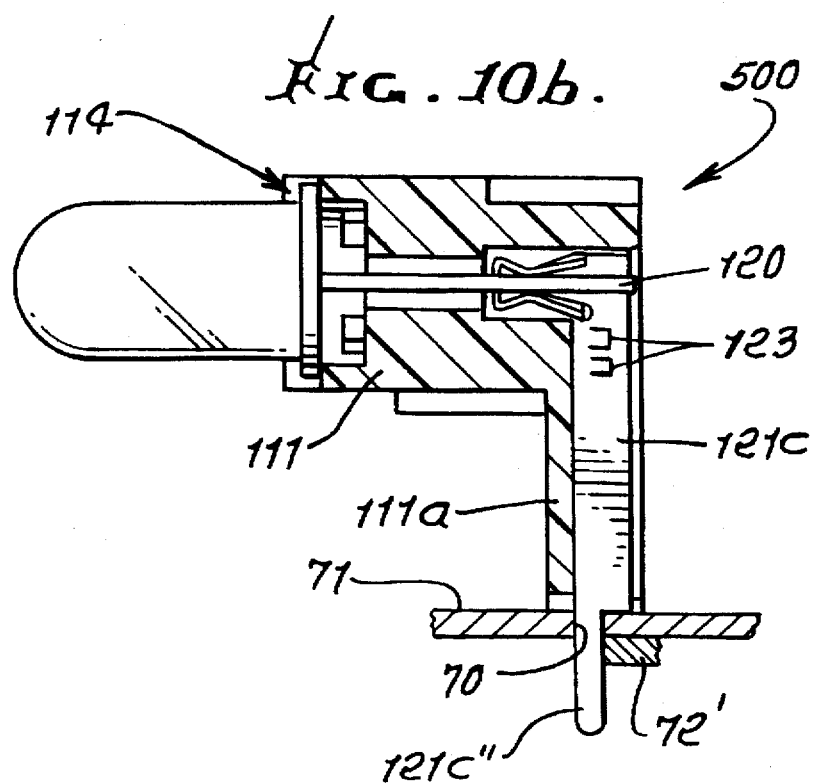
Figure 10C:
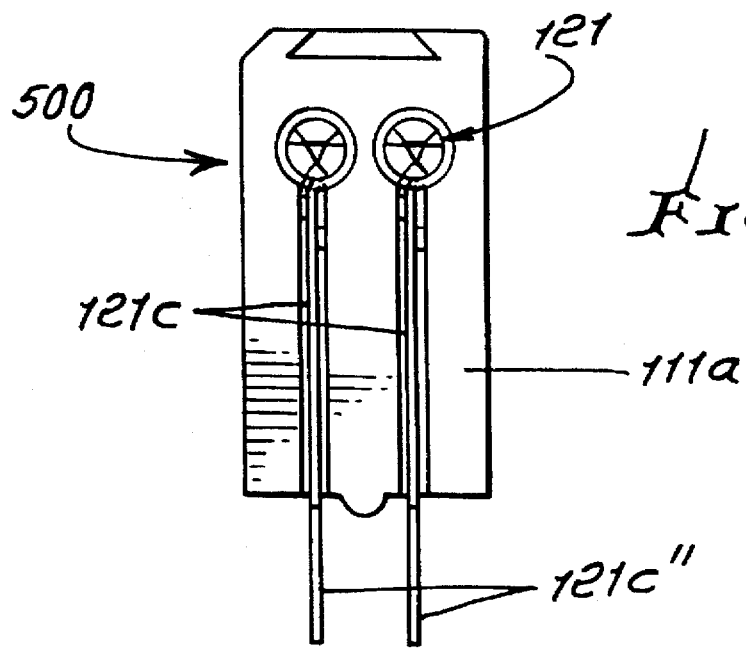
Figure 10D:
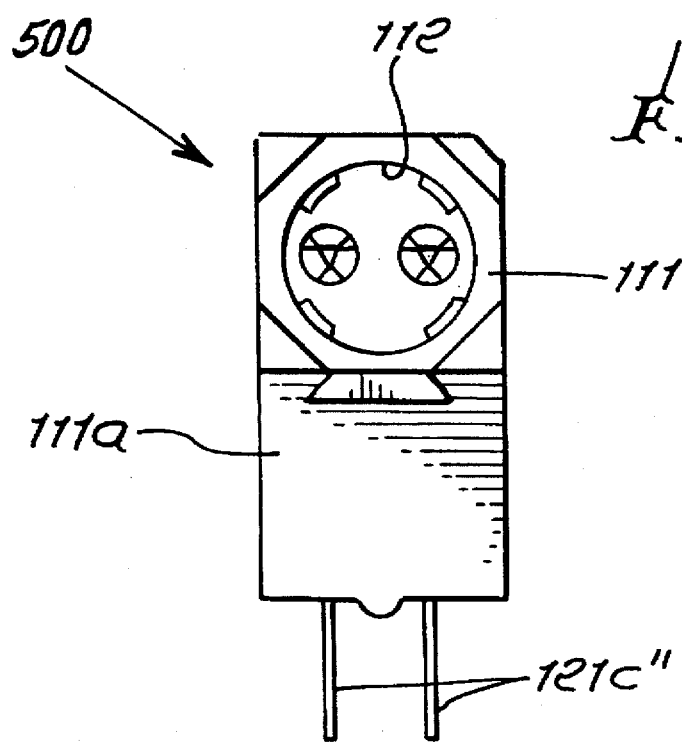
Figure 13A:
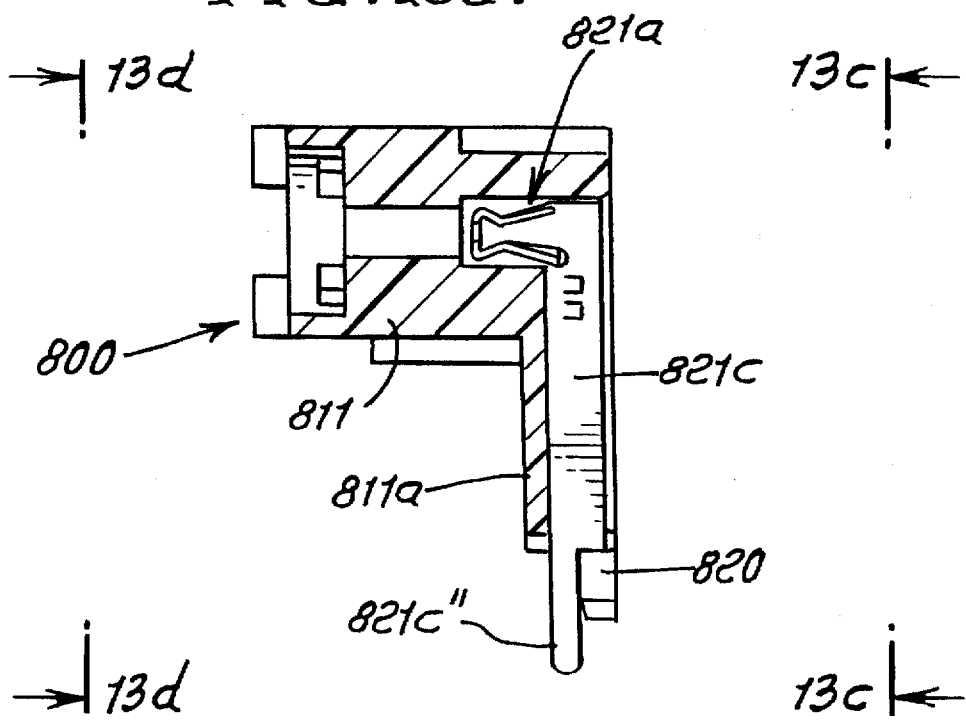
Figure 13B:
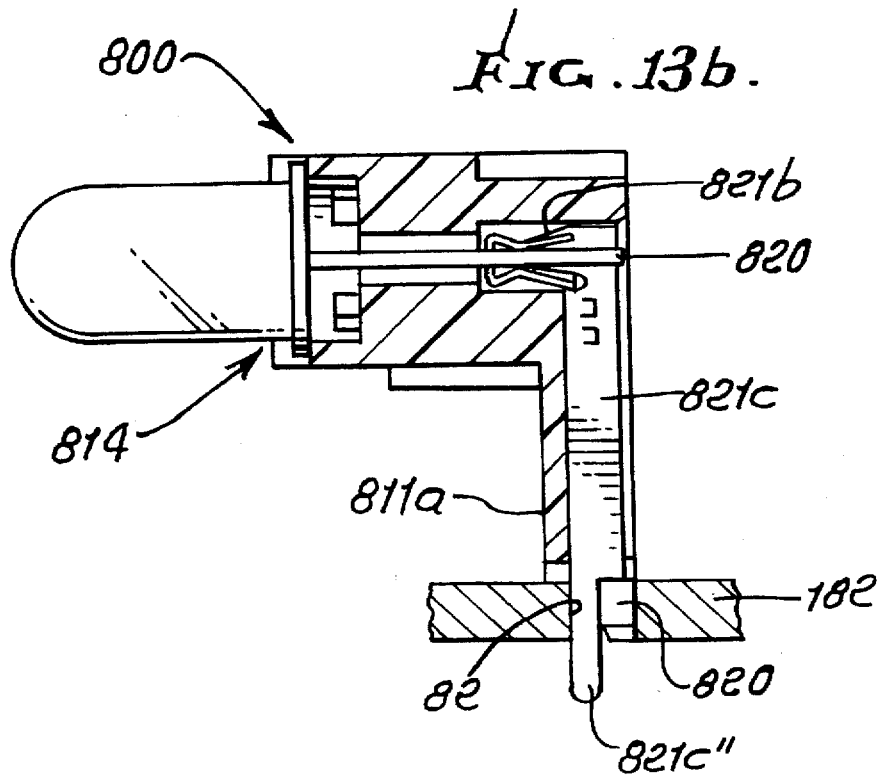
Figure 13D:
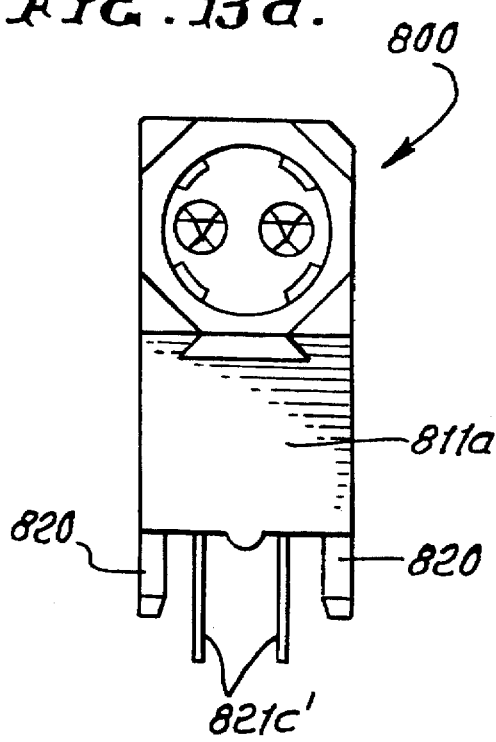
Figure 13C:
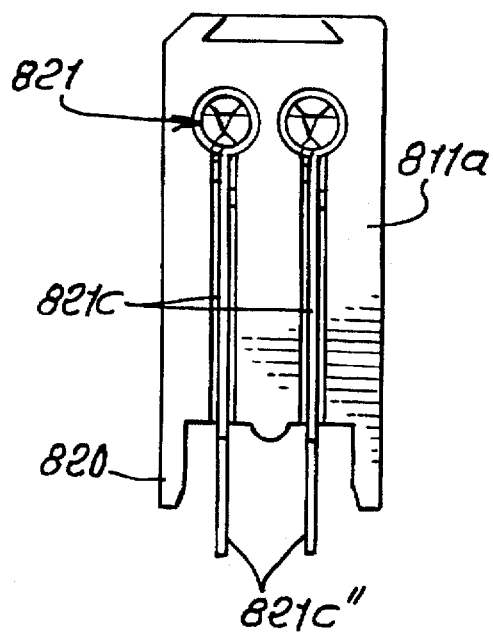
Figure 13E:
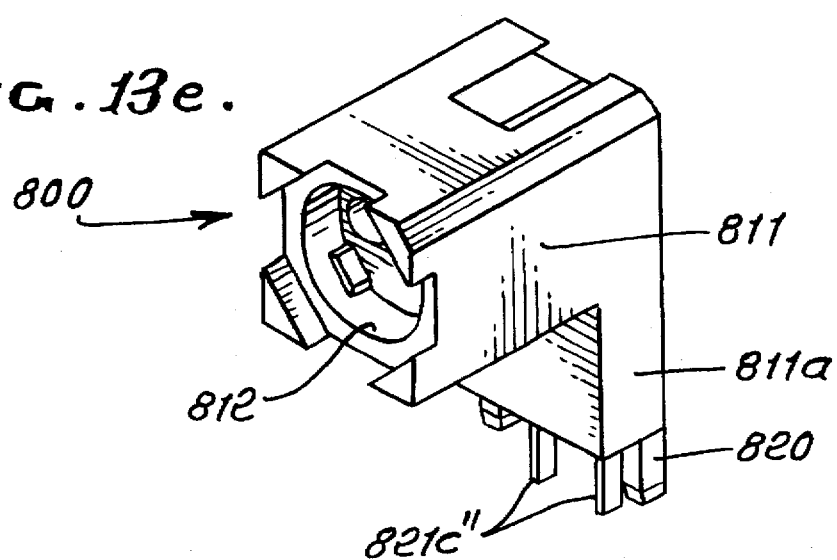

FIGS. 6(b)–6(d) are views like FIGS. 5(b)–5(d), but showing the FIG. 6(a) connector;

FIG. 7(a) is a view like FIG. 6(a), but showing the next in sequence larger connector of FIG. 3;

FIGS. 7(b)–7(d) are views like FIGS. 6(b)–6(d), but showing the FIG. 7(a) connector;

FIG. 8(a) is a view like FIG. 7(a), but showing the next in sequence larger connector of FIG. 3;

FIGS. 8(b)–8(d) are views like FIGS. 7(b)–7(d), but showing the FIG. 8(a) connector;

FIG. 9(a) is a vertical section taken through the smallest connector shown in FIG. 4;

FIG. 9(b) is view like FIG. 9(a), but showing a light unit attached;

FIG. 9(c) is a right end view taken on lines 9(c)—9(c) FIG. 9 (a);

FIG. 9(d) is a left end view taken on lines 9(d)—9(d) of FIG. 9(a);

FIG. 10(a) is a view like FIG. 9(a) but showing the next larger in sequence connector of FIG. 4;

FIGS. 10(b)–10(d) are views like FIGS. 6(b)–6(d) but showing the FIG. 10(a) connector;

FIGS. 11(a)–11(d) are views like FIGS. 10(a)–10(d) but showing the next larger in sequence connector of FIG. 4;

FIGS. 12(a)–12(d) are views like FIGS. 11(a)–11(d) but showing the next larger in sequence connector of FIG. 4;

FIG. 13(a) is a view like FIG. 10(a) but showing a support leg on a stand-off mount;

FIG. 13(b) is a view like FIG. 13(a) but showing a light unit attached;

FIG. 13(c) is a right end elevational view taken on lines 13(c)—13(c) of FIG. 13(a);

FIG. 13(d) is a left end elevational view taken on lines 13(d)—13(d) of FIG. 13(a); and FIG. 13(e) is a perspective view of the connector of FIGS. 13(a)-13(d).

DETAILED DESCRIPTION

Referring first to FIGS. 1–3, 5(a) and 5(b) a connector 10 includes a one-piece molded plastic body 11 having a recessed end 12 adapted to serve as a support for a circuit element or component, having terminal means. One example of a circuit element is a light unit such as LED 14. The body defines a longitudinally horizontally forwardly opening recess 12a to receive the base 15 of the circuit element, as seen in FIG. 5(b). Base 15 may be circular, for reception within a body cylindrical wall 16. A reduced diameter cylindrical wall 17 extends between lateral shoulder 18 and a body rear wall 19.

Rear wall 19 defines through opening means 19a to receive insertion of rod-like terminal means 20 projecting rearwardly from the base 15 of the circuit element. Of advantage is the fact that the through opening means 19a may accommodate different configurations or groupings of circuit element terminals, while also accommodating retention of such terminals as by terminal structure 21. The latter includes two terminal sockets 21a in circularly or bent condition and each having three inwardly deformed spring fingers 21b spaced about a horizontal axis to slidably receive a rod-like terminal 20. Accordingly, effective bent terminal retention or captivating means is provided for ease of retention and electrical contact with the rod-like terminals 20, i.e. the rearward extent of the terminal means.

The terminal structure 21 also extends vertically downwardly at 21c relative to the socket 21a for electrical connection with circuitry associated with a circuit board. See FIGS. 1 and 2 the lower end of 21c, bent laterally at 21c' for electrical connection to wave solder or other connection 100 electrically connected at 101 to circuit board circuitry. Bend or foot 21c' also serves to support the body 11, when soldered to 100. Molded plastic body 11 forms a stand-off support or mount at 11a extending downwardly about the terminal structure 21c. Accordingly, such terminal structure 21 has L-shaped configuration (i.e. legs 21a and 21c), and the stand-off mount also has L-shaped configuration, such L-shape having been pre-formed for stability and simplicity. Sidewardly angled tabs 23 on 21c engage the inner wall of the plastic mount to hold the structure 21a, 21b and 21c in position in the mount. Two downwardly extending terminal structures 21c are shown, as in FIG. 5(c), with laterally oppositely extending feet 21c'.

FIGS. 6(a)–6(d) illustrate a closely similar connector 110 including a one-piece, L-shaped, molded plastic body 111 having a recessed end 112 to serve as a support for a circuit element component, having terminal means. See for example light unit such as LED 114. Elements of the connector the same as those of FIGS. 5(a)–(d) bear the same identifying numerals, with a numeral "1" preceding the remainder of the numeral. Note, however that the terminal structure 121 extends downwardly at 121c to greater extent than structure 21c. This is to enable mounting of 110 on 10 to extend above 11 and also downwardly rearwardly of 11a. See FIG. 2. Note vertically elongated stand-off mount 111a, extending downwardly to the bottom level of 11a, and directly rearwardly thereof. Feet 121c' extend horizontally oppositely, in the same horizontal plane as feet 21c' to connect to circuitry 200 on the circuit board.

Figure 1:
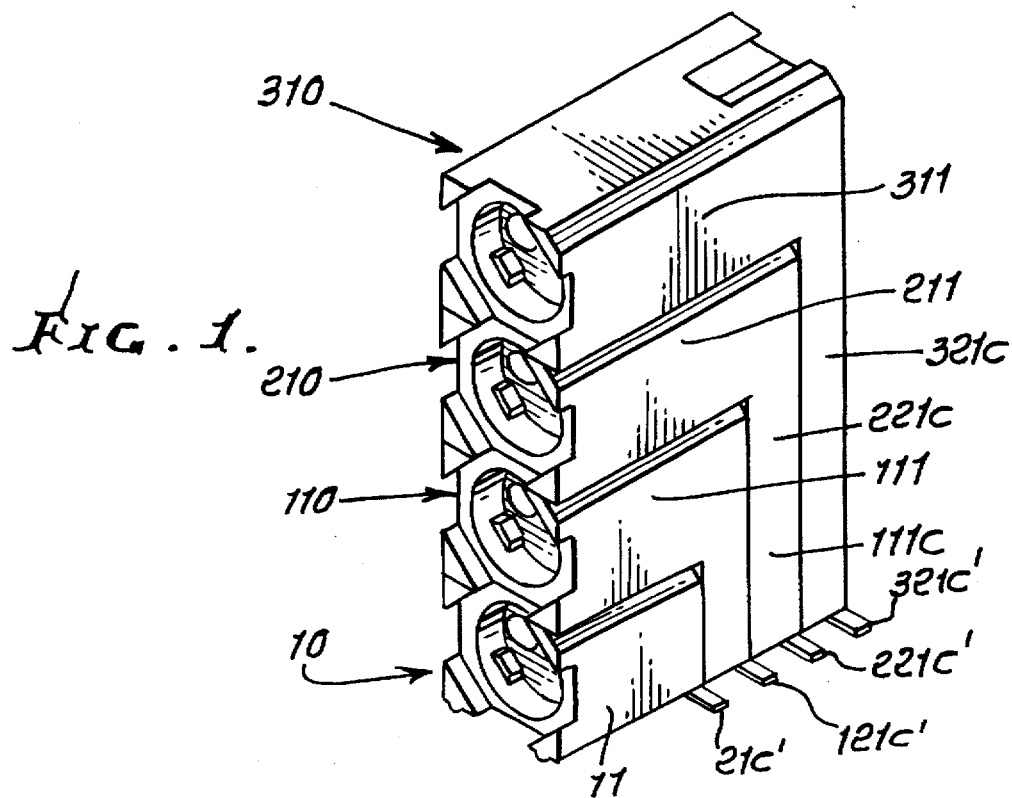
FIG. 1 is a perspective view of multiple connectors which are interconnected and stacked, and showing progressively elongated stand-off mounts.
Figure 2:
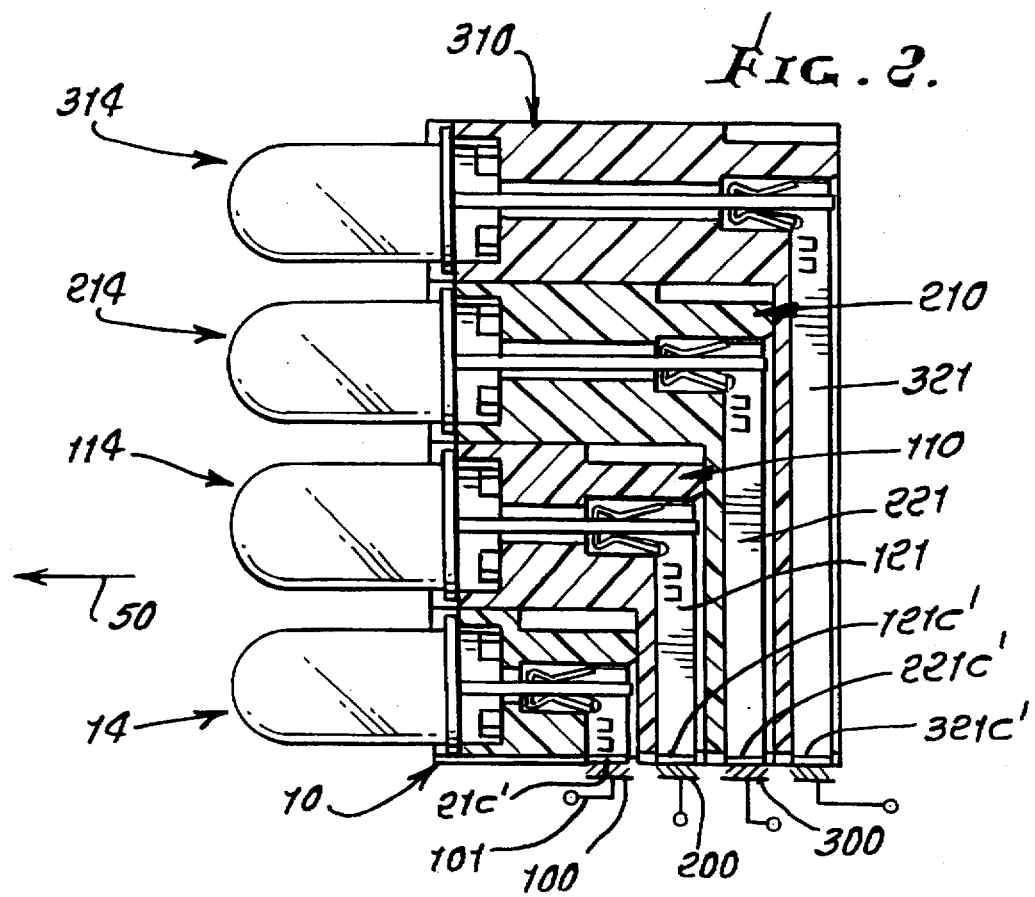
FIG. 2 is a vertical section taken through the FIG. 1 stacked multiple connectors.

Also provided on 10 and 110 is or are interconnect means, to enable slidable interconnection of 10 and 110, as in the direction of arrow 50, in FIG. 2, whereby the connectors are stacked vertically, in piggy-back relation. Such interconnect means includes tongue and groove elements that extend forwardly and horizontally. See for example dovetail groove 51 sunk in the top wall 52 of 10, to intersect rear wall 19, and the mating dovetail tongue 153 protruding downwardly from the lower wall 154 of 110, as shown in FIGS. 5(a) and 6(a). Interengaged stop shoulders are shown at 55 and 156, to limit sliding interconnection in direction 50. The form of the invention seen in FIGS. 1–6 may be regarded as preferred; however, other forms as described below, are also desirable.

FIGS. 7(a)–7(b) illustrate another closely similar connector 210, including a one-piece, L-shaped, molded plastic body 211, having a recessed end 212 to serve as a support for a circuit element or component, having tensional means. See for example light unit such as LED 214. Elements of the connector the same as those of FIGS. 5(a)–5(d) bear the same illustrated numerals with a numeral "2" preceding the remainder of the numeral. Note however, that the terminal structure 221 extends downwardly at 221c to greater extent than structures 21c and 121c. This is to enable mounting of 211 on 111 to extend above 11, and above 111, and also downwardly rearwardly of 111a. See FIG. 2. Note vertically elongated stand-off mount 221c, extending downwardly to the bottom level of 11a and 111a, and directly rearwardly of 111a. Feet 221c' extend horizontally oppositely, on the same horizontal plane as feet 21c' and 121c' to connect to circuitry 300 on the circuit board.

Also provided on 110 and 210 is an interconnect means to enable slidable interconnection of 110 and 210, as in direction 50, whereby the connectors are stacked vertically or perpendicularly relative to the circuit board in piggy-back relation. Such interconnect means include tongue and groove elements, that extend forwardly and horizontally, parallel to the circuit board. See for example dovetail groove 151 sunk in the top wall 152 of 110, to intersect rear wall 19, and the mating dovetailed tongue 253 that protrudes downwardly from the lower wall 254 of 210, as shown in FIGS. 7(a) and 7(b). Interengaged stop shoulders are shown at 155 and 256, to limit sliding interconnection in direction 50.

Like structure exists for the next larger connector 310, shown in FIGS. 8(a)–8(d), as indicated by corresponding numerals having the initial digit "3".

FIGS. 9(a)–9(d) and FIG. 4 illustrate a connector 400 like connector 10 in all respects, and bearing corresponding identification numerals, except as to the lower ends of the terminal structure 21c. Such lower ends at 21c" extend straight down, to pass through openings 70 in the circuit board 71, and to connect to circuitry 72 (such as wave solder) below the board.

FIGS. 10(a)–10(d) and FIG. 4 illustrate a connector 500 like connector 110 in all respects, and bearing corresponding numerals, except that the lower ends 121c" of the terminal structure 121c extend straight down, in perpendicular relation to the circuit board 71 to pass through openings 70 therein and connect to circuitry 72 (or 72' if different from 72), below the board.

FIGS. 11(a)–11(d) and FIG. 4 illustrate a connector 600 like connector 210 in all respects, and bearing corresponding numerals, except that the lower ends 221c" of the terminal structure 221c extend straight down to pass through openings 70 in the circuit board and connect to circuitry 72 (or 72" if different from 72 or 72') below the board.

FIGS. 12(a)–12(d) and FIG. 4 illustrate a connector 700 like connector 310 in all respects, and bearing corresponding numerals, except that the lower ends 321c" of the terminal structure 321c extend straight down to pass through openings 70 in the circuit board, and connect to circuitry 72 (or 72'" if different from 72 or 72' or 72") below the board.

FIGS. 13(a)–13(e) show a structure 800 like that of FIGS. 10(a)–10(d), except for the added provision of two support legs or pins 820 that project downwardly from the lower end of the stand-off mount, to extend into holes 82, in the circuit board 182, providing additional support. Pins 820 may be molded integrally with the molded plastic stand-off 811a of the connector, to project downwardly, near the lower ends 821c" of the terminal structure down-leg or legs 821c.

I claim:

1. For use in an assembly including a circuit element having a base and terminal means projecting rearwardly from the base, a connector comprising the combination:

a) a body defining a forwardly and horizontally extending structure for telescopically interfitting the base of the element for retention thereto, with said terminal means extending rearwardly, b) the body having associated terminal structure movably electrically connectible with rearward extent of said terminal means, said terminal structure extending downwardly for electrical connection to circuitry associated with a circuit board, c) there being interconnect means located on said body to connect to an associated connector, whereby the connectors are then stacked vertically, d) and including said associated connector which has a stand-off mount projecting downwardly rearwardly of the first mentioned connector, e) said interconnect means including tongue and groove elements on the connector and associated connector, and extending forwardly and horizontally, said connector and associated connector having relatively horizontally and forwardly slidable interfit when connected by said interconnect means, and wherein said associated connector has L-shape to extend above said connector and also downwardly rearwardly of said connector, f) said body including a portion extending downwardly adjacent said terminal structure which extends downwardly, there being tab means on said terminal structure which extends downwardly to retainingly engage said body portion extending downwardly.

2. The combination of claim 1 wherein said terminal structure includes a socket to slidably receive said terminal means when said base of the element is telescopically interfitted with said body structure.

3. The combination of claim 1 wherein said body includes a downwardly extending leg to interfit the circuit board and provide additional support for said body and terminal structure.

4. The combination of claim 1 wherein said stand-off mount defines a channel receiving said terminal structure.

5. The combination of claim 4 wherein said mount has a lower end to project in proximity to a circuit board, said terminal structure projecting below the level of said mount lower end.

6. The combination of claim 5 wherein said terminal structure has a lowermost portion extending generally horizontally adjacent said mount lower end.

7. The combination of claim 5 wherein said terminal structure has a lowermost portion projecting downwardly below said mount lower end, for electrical connection to circuitry at the circuit board.

* * * * *